United States Patent
Kang et al.

(10) Patent No.: US 8,305,103 B2
(45) Date of Patent: Nov. 6, 2012

(54) SOLID STATE DRIVE TESTING APPARATUS TO SORT THE SOLID STATE DRIVES ACCORDING TO A DETERMINED OPERABILITY OF EACH DRIVE

(75) Inventors: Seonggoo Kang, Seoul (KR); Chulwoong Jang, Cheonan-si (KR); Jaeil Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 316 days.

(21) Appl. No.: 12/720,095

(22) Filed: Mar. 9, 2010

(65) Prior Publication Data

US 2010/0235693 A1    Sep. 16, 2010

(30) Foreign Application Priority Data

Mar. 12, 2009  (KR) .................. 10-2009-0021318

(51) Int. Cl.
*G01R 31/20*    (2006.01)

(52) U.S. Cl. .................. 324/757.01; 324/757.04
(58) Field of Classification Search .................. None
See application file for complete search history.

(56) References Cited

U.S. PATENT DOCUMENTS

| 3,664,499 | A * | 5/1972 | Sahakian | 209/573 |
| 6,248,967 | B1 * | 6/2001 | Nakamura | 209/573 |
| 2011/0154113 | A1 * | 6/2011 | Dalphy et al. | 714/35 |
| 2011/0176864 | A1 * | 7/2011 | Shin et al. | 403/270 |

FOREIGN PATENT DOCUMENTS

| JP | 2004-355703 | 12/2004 |
| KR | 2004-98684 | 11/2004 |
| KR | 2007-17483 | 2/2007 |

* cited by examiner

*Primary Examiner* — Vinh Nguyen
(74) *Attorney, Agent, or Firm* — Stanzione & Kim, LLP

(57) ABSTRACT

Provided are apparatus and method of testing solid state drives. The method includes accommodating solid state drives to be tested in a magazine with one or more cassettes, sorting the solid state drives into operable solid state drives or defective solid state drives by testing electrical characteristics, and loading the sorted solid state drives.

6 Claims, 10 Drawing Sheets

SOLID STATE DRIVE TESTING APPARATUS TO SORT THE SOLID STATE DRIVES ACCORDING TO A DETERMINED OPERABILITY OF EACH DRIVE

CROSS-REFERENCE TO RELATED APPLICATIONS

This application claims priority under 35 U.S.C. §119 from Korean Patent Application 10-2009-0021318, filed on Mar. 12, 2009, the disclosure of which is hereby incorporated herein in its entirety by reference.

BACKGROUND

1. Field of the Invention

The present disclosure herein relates to solid state drive testing apparatus and method, and more particularly, to solid state drive testing apparatus and methods that automatically test the solid state drive in a bare state.

2. Description of the Related Art

In the past, magnetic disk drives have been mainly used as data storage devices in electronic systems such as computer systems. However, with the development of semiconductor technologies, instead of the magnetic disk drives, solid state drives (SSDs) are being widely used as a storage device in electronic systems. These SSDs use nonvolatile memories such as flash memories as a storage device.

Since the SSDs store data using devices such as flash memories, the SSDs have advantages of fast access rate, high integration, and stability against external impact. The SSDs are shortened in booting time compared to HDDs when used as a booting drive.

SUMMARY

The present general inventive concept provides a solid state drive testing apparatus and method of testing to improve efficiency in a testing of a solid state drive.

Additional features and utilities of the present general inventive concept will be set forth in part in the description which follows and, in part, will be obvious from the description, or may be learned by practice of the general inventive concept.

Embodiments of the present general inventive concept provide an apparatus to test solid state drives, including a testing unit to test electrical characteristics of the solid state drives by applying test signals to the solid state drives, a server that receives test results of the solid state drives from the testing unit and stores the tested results, and a sorting-loading unit that sorts the solid state drives transferred from the testing unit into operable solid state drives or defective solid state drives according to the test results transmitted from the server, and loads the sorted solid state drives.

The solid state drives may electrically be connected to the testing unit through at least one magazine accommodating cassette on which the solid state drives are mounted, and the solid state drives may be transferred to the sorting-loading unit by a movement of the magazine.

The magazine may include a housing formed with slots onto which the cassettes are loaded, and second electrical connection members installed in the housing to connect first electrical connection members of the cassettes loaded onto the slots with the testing unit.

In exemplary embodiments of the present general inventive concept, each of the cassettes may include a base frame provided with the first electrical connection member, and a tray provided on the base frame to mount the solid state drive thereon, the tray being linearly movable toward the first electrical connection member. An external connection terminal of the solid state drive mounted on the tray is connected to the first electrical connection member by the linear movement of the tray.

The apparatus may include a guide rail that is provided at the tray along a linearly moving direction, a guide groove that is formed at the base frame to guide movement of the guide rail, where the tray may be detachably secured to the base frame by attachment of the guide rail to the guide groove and detachment of the guide rail from the guide groove.

The first electrical connection member of the apparatus may include a connector to connect with the external connection terminal of the solid state drive, a connector bracket to couple the connector with the base frame, and a circuit substrate that is electrically connected to the connector and connected to the second electrical connection member of the magazine.

The cassette of the apparatus may further include a displaying unit that displays whether the external connection terminal of the solid state drive is connected to the connector of the cassette.

The apparatus may include loading protrusions that may be formed at both sides of a moving path of the tray on an upper surface of the base frame, and loading grooves may be formed at a lower face of the base frame to correspond to the loading protrusions.

Exemplary embodiments of the present general inventive concept may also provide a method of testing solid state drives, the method including testing electrical characteristics of the solid state drives by connecting a testing unit to a magazine accommodating cassettes on which the solid state drives are mounted, storing tested results of the solid state drives in a server, storing tested results of the solid state drives in a server, sorting the solid state drives into operable solid state drives or defective solid state drives according to the test results transmitted from the server, and loading the sorted solid state drives by moving the magazine into a sorting-loading unit.

The method may include where the test results, which are transmitted from the testing unit to the server and from the server to the sorting-loading unit, also include an identification number of the magazine, a loading position of the solid state drives in the magazine, and information about whether the solid state drives are operable.

Exemplary embodiments of the present general inventive concept also provide a method of testing solid state drives, including loading a magazine including the solid state drives to be tested into a testing unit, applying one or more electrical signals to the solid state drives with the testing unit, determining operability of each of the solid state drives for one or more predetermined operations based on the applied electrical signals; and sorting the solid state drives into operable or non-operable solid state drives according to the determined operability of each of the solid state drives.

Exemplary embodiments of the present general inventive concept also provide an apparatus to test solid state drives, including a testing unit to receive a magazine including the solid state drives to be tested, to apply one or more electrical signals to the solid state drives with the testing unit, and to determine operability of each of the solid state drives for one or more predetermined operations based on the applied electrical signals, and a sorting unit to sort the solid state drives into operable or non-operable solid state drives according to the determined operability of each of the solid state drives.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
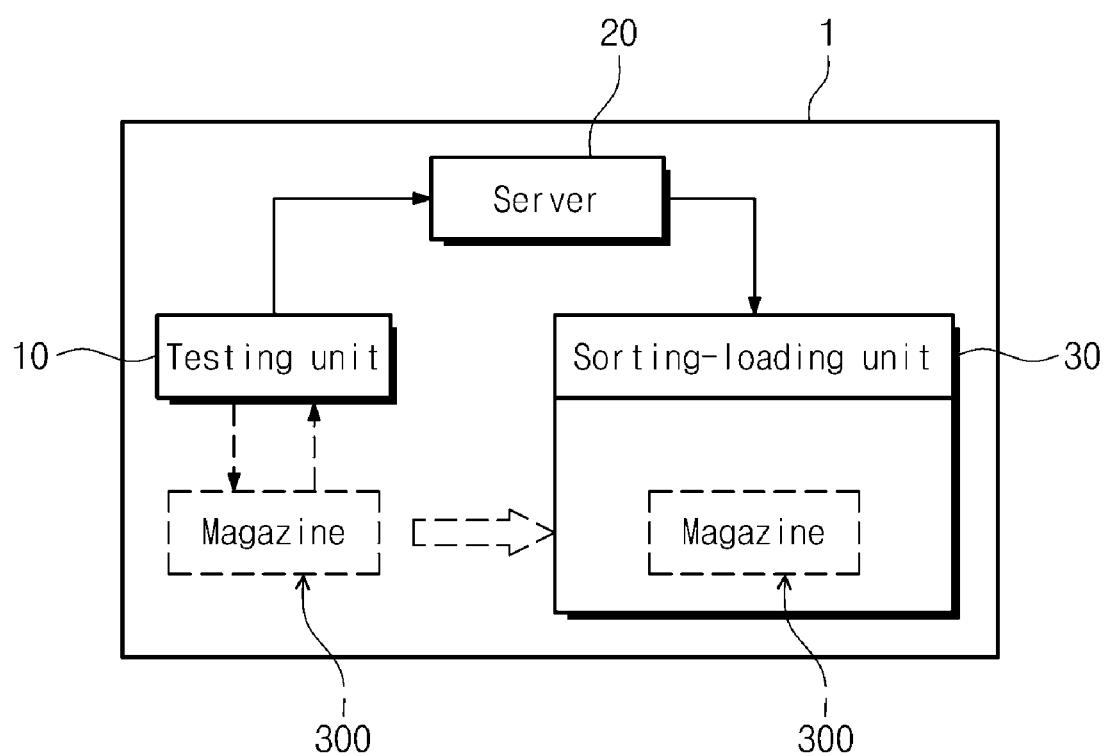
FIG. 1 is a diagram illustrating a configuration of a solid state drive testing apparatus according to exemplary embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
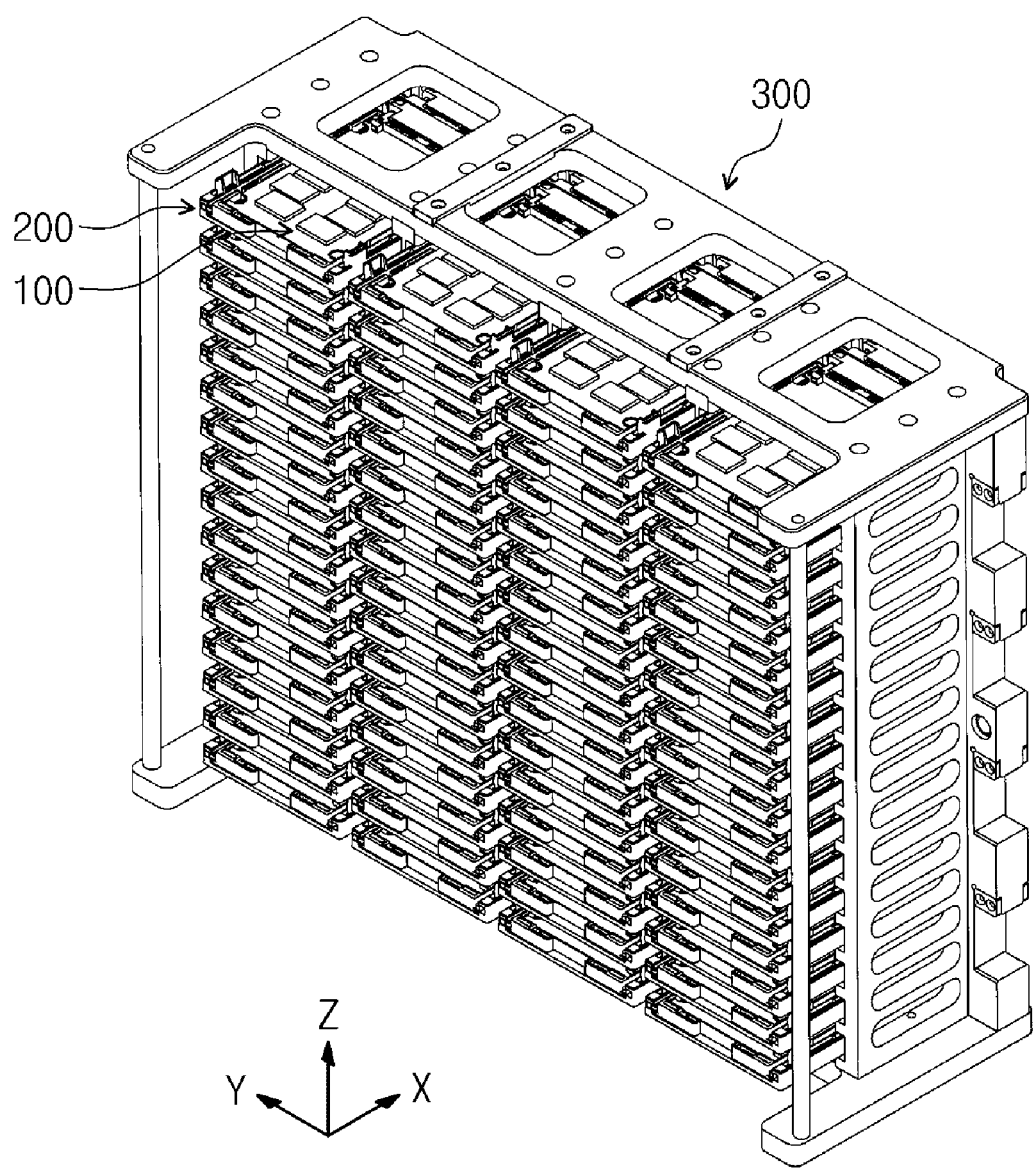
FIG. 2 illustrates a perspective view of a magazine accommodating cassettes on which solid state drives are mounted according to exemplary embodiments of the present general inventive concept.

FIG. 1 illustrates a solid state drive testing apparatus 1 according to exemplary embodiments of the present general inventive concept, and FIG. 2 illustrates a perspective view of a magazine accommodating cassettes on which solid state drives can be mounted.

Referring to FIGS. 1 and 2, the solid state drive testing apparatus 1 includes a testing unit 10, a server 20, and a sorting-loading unit 30. Hereinafter, the solid state drive is referred to as an "SSD."

The SSD 100 may be in a bare state in which the SSD 100 is not enclosed in an external case (not illustrated), or the external case is not mounted on the SSD 100. The SSDs 100 to be tested may be mounted on cassettes 200, respectively, and the cassettes 200 may be accommodated in a magazine 300. A plurality of cassettes 200 may be accommodated in the magazine 300. The SSD 100 may be enclosed by the external case after being tested by the solid state drive testing apparatus 1.

The magazine 300 may be electrically connected to the testing unit 10. The testing unit 10 may apply one or more electrical signals to the SSDs 100 through the cassettes 200 and the magazine 300 to determine whether or not the SSDs 100 are defective (e.g., one or more predetermined operations of the SSDs are non-operational). For example, the testing unit 10 may apply one or more electrical signals to the SSDs 100 to determine whether the one or more of the SSDs 100 operate in a predetermined operation mode when the one or more electrical signals are applied. If one or more of the SSDs 100 do not operate and/or perform a predetermined operation when the one or more electrical signals are applied, the testing unit 10 may determine that such a tested SSD 100 is defective.

The testing unit 10 may apply one or more electrical signals to the SSDs 100 and may determine an operability of one or more predetermined operating functions of the SSDs 100. For example, electrical signals received from one or more of the SSDs 100 by the testing unit 10 may indicate that the SSDs can perform a predetermined operating function, and if electrical signals are not received, the one or more SSDs 100 that do not send return signals may be determined to be defective by the testing unit 10. Alternatively, the return signals may include information to indicate to the testing unit 10 that the predetermined operating function could not be performed. SSDs 100 that send such signals may be determined to be defective by the testing unit 10.

The server 20 receives the test results of the SSDs 100 for each magazine from the testing unit 10 and stores the test results (e.g., in a digital storage device, memory, etc.). The server 20 may send the test results of the SSDs 100 for each magazine to the sorting-loading unit 30. Here, the test results of the SSDs 100 for each magazine may include an identification number of the magazine 300, a loading position of the SSDs 100 in the magazine 300, and information about whether the SSDs 100 meet one or more predetermined test requirement (i.e., the SSDs are "acceptable," "operable," etc.) or are defective (i.e., the SSDs are "non-operational," etc.).

The magazine 300, which loads and/or receives the tested SSDs 100 (e.g., SSDs that have been determined to be operable by the testing unit 10, SSDs that have been determined to be defective, or a combination thereof), may be transferred to the sorting-loading unit 30. The sorting-loading unit 30 may sort and load the cassettes 200 on which the SSDs 100 are mounted, in accordance with the test results about whether the SSDs 100 is operable or defective. A robot (not illustrated) may be provided in the sorting-loading unit 30. The robot (not illustrated) may retrieve one or more of the cassettes 200 from the magazine 300, and load one or more cassettes 200 that include the operable SSDs 100 and one or more other cassettes 200 that include the defective SSDs 100 onto one or more individual conveyance trays (not illustrated).

Figure 3:
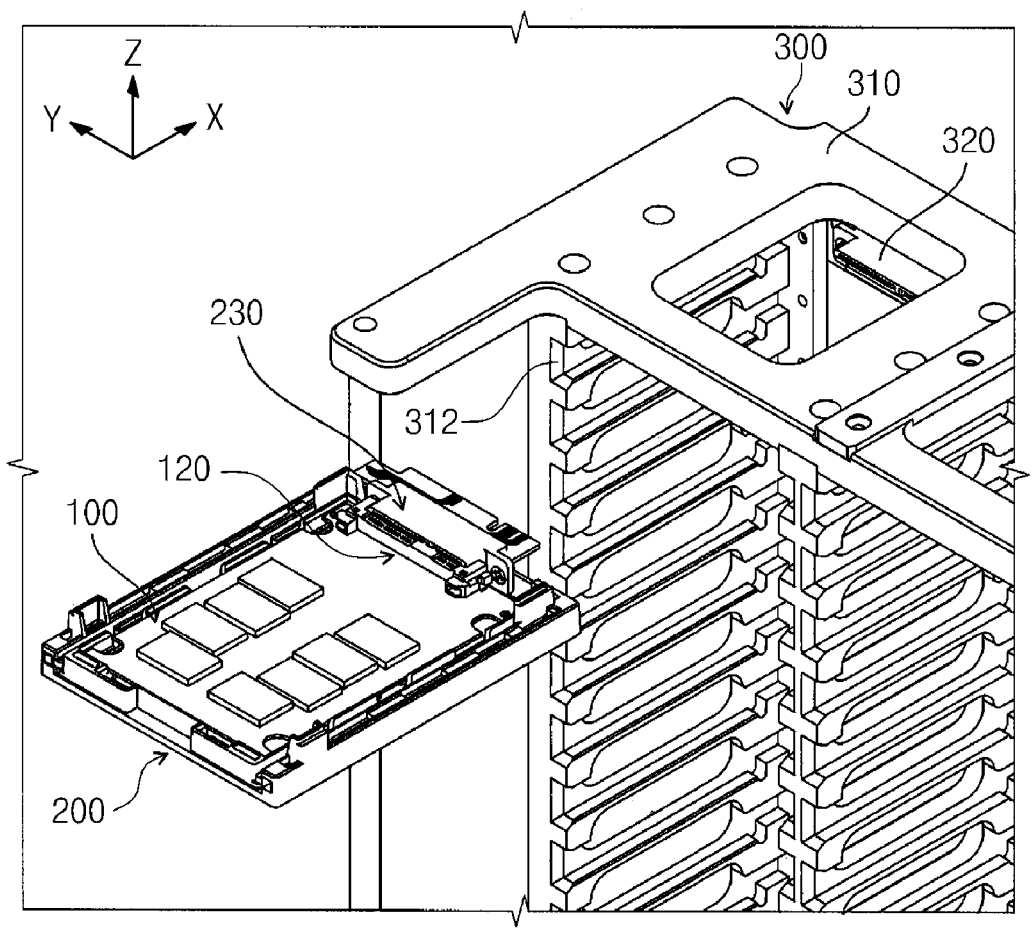
FIG. 3 illustrates a perspective view of a magazine and a cassette to be connected to the magazine according to exemplary embodiments of the present general inventive concept.

FIG. 3 illustrates a perspective view of a magazine and a cassette to be connected to the magazine according to exemplary embodiments of the present general inventive concept.

Referring to FIG. 3, the magazine 300 may include a housing 310 formed with slots 312. The slots 312 may be stacked in a vertical direction (Z-direction) to form a multi-layered structure. In each layer, the plurality of slots 312 may be provided in a horizontal direction (Y-direction). The lengthwise direction of the slots 312 faces the X-direction vertical to the Z-direction and Y-direction.

The lengthwise direction of the cassette 200 may face the X-direction, and the cassette 200 may be loaded onto the slot 312 along the X-direction. On the basis of the loaded direction of the cassette 200, a first electrical connection member 230 is provided at the distal end, and a second electrical connection member 320 may be provided at a position facing the first electrical connection member 230 in the housing 310.

The first electrical connection member 230 of the cassette 200 may be electrically connected to the second electrical connection member 320 of the magazine 300. The first electrical connection member 230 may be electrically connected to an external connection member 120 of the SSD 100 mounted on the cassette 200. The testing unit 10 may be electrically connected to the second electrical connection member 320.

Electrical signals of the testing unit 10 may be applied to the SSD 100 through the second electrical connection member 320, the first electrical connection member 230, and the external connection terminal 120 in this order. The signals to be checked by the testing unit 10 from the SSDs are transmitted to the testing unit 10 from the SSD 100 in reverse order (i.e., from the external connection terminal 120, to the first electrical connection member 230, and to the second electrical connection member 320).

Figure 4:
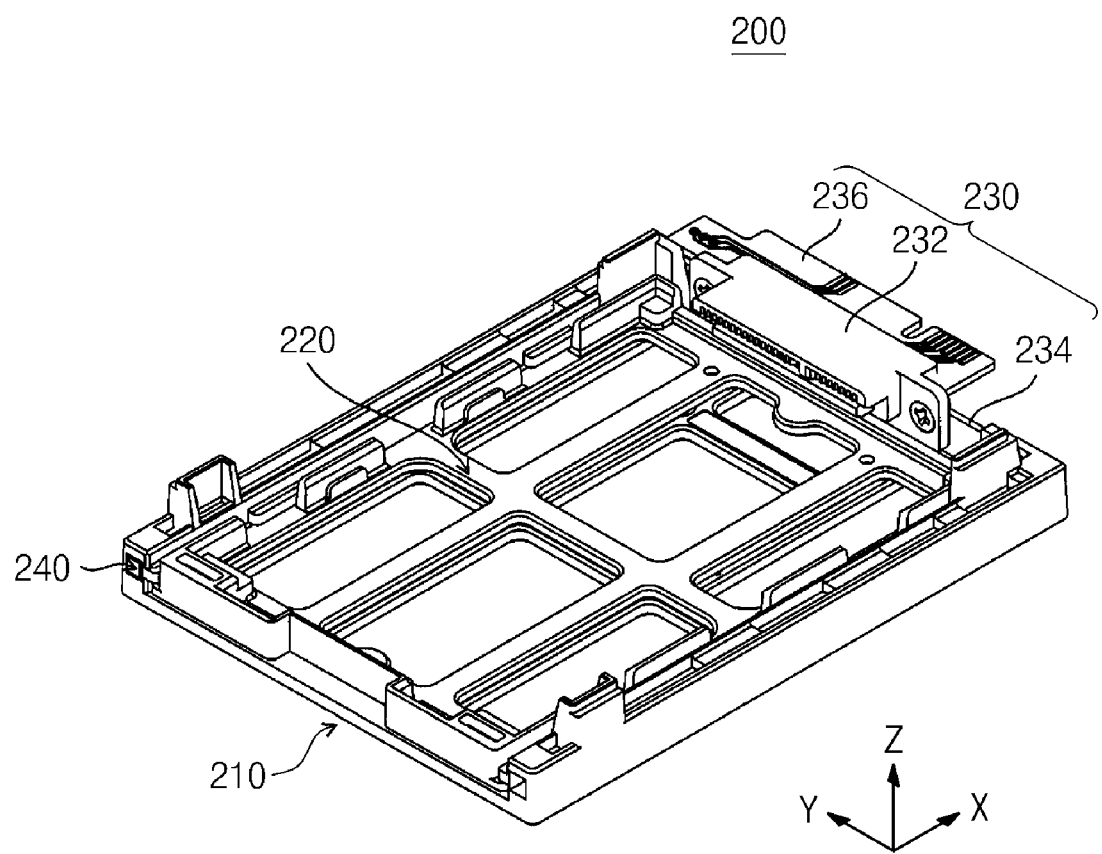
FIG. 4 illustrates a perspective view of the cassette of FIG. 3.
Figure 5:
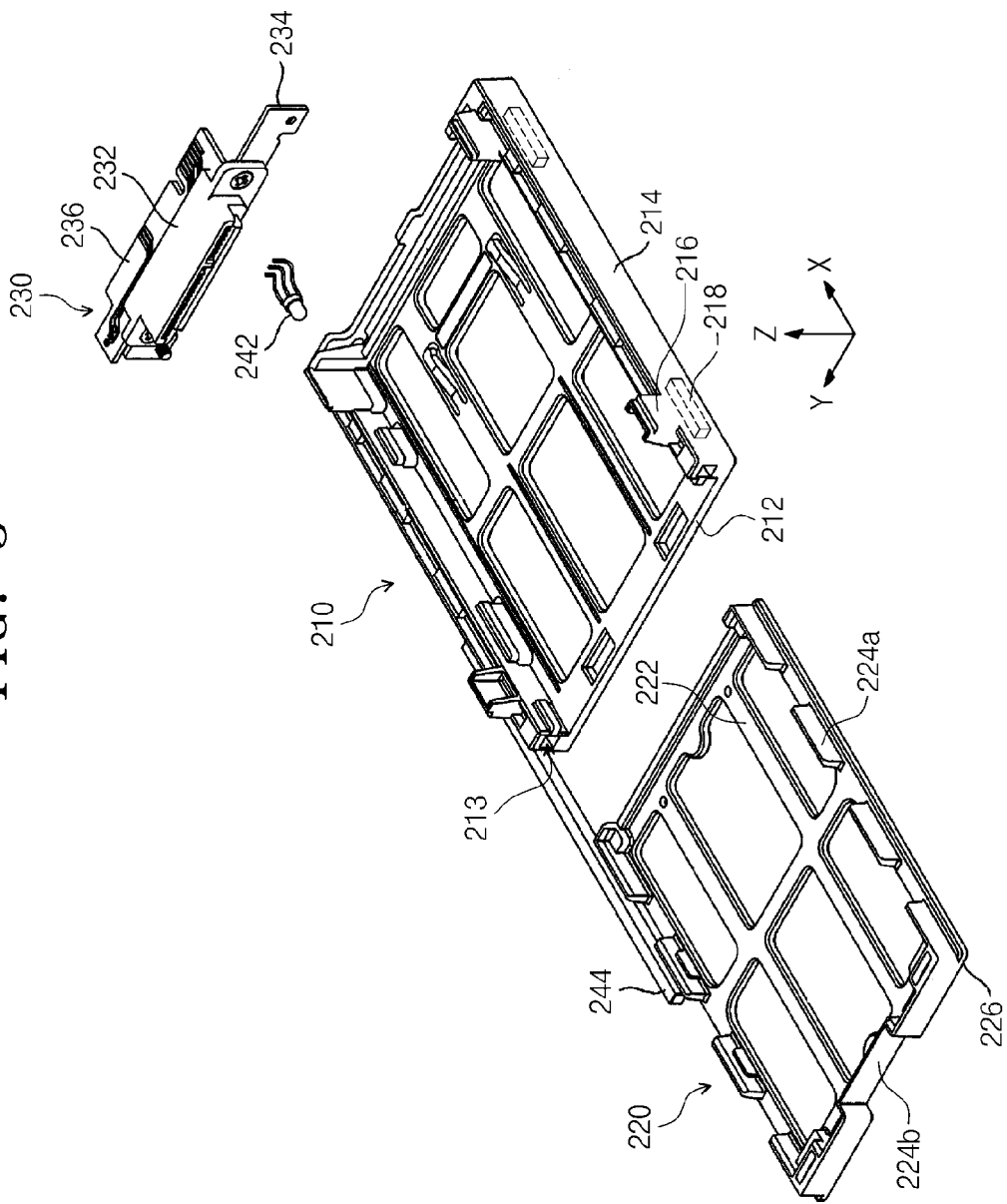
FIG. 5 illustrates an exploded perspective view of the cassette of FIG. 4.
Figure 6:
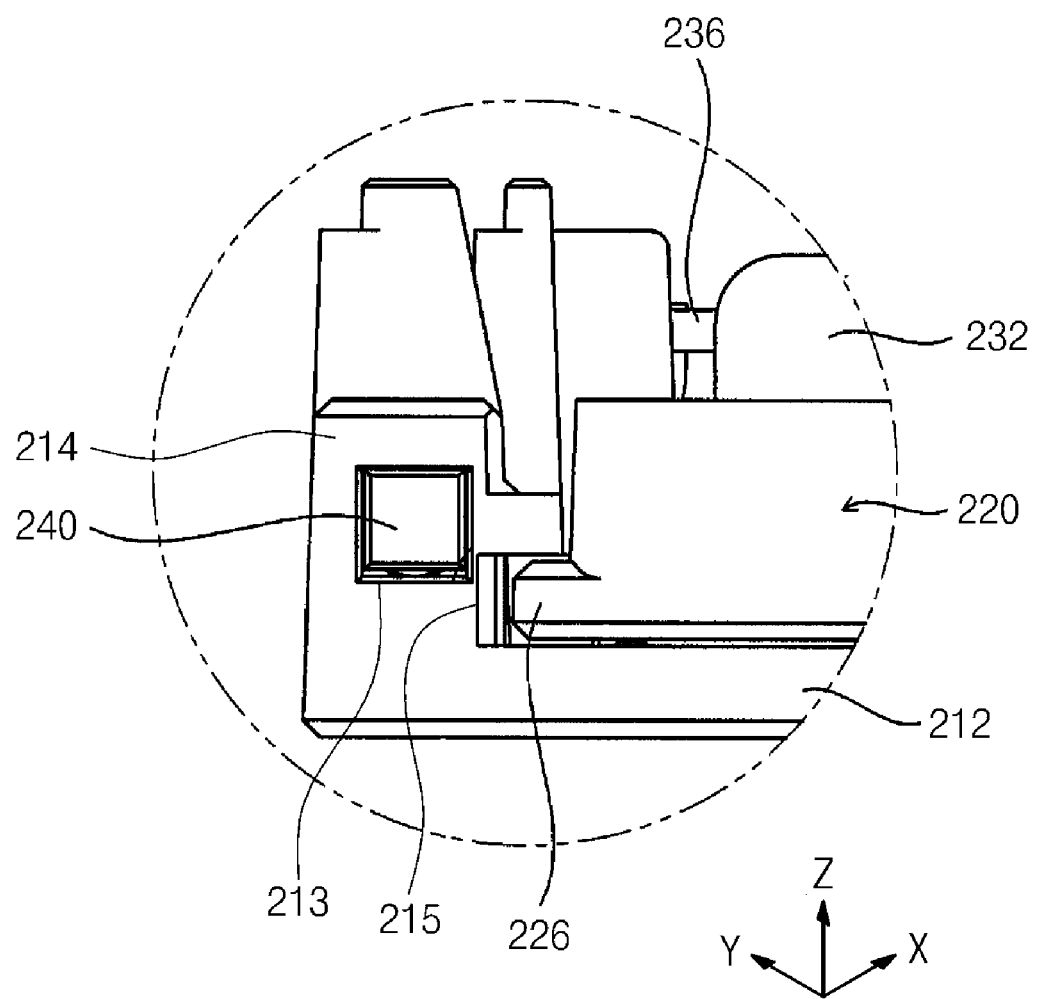
FIG. 6 illustrates an enlarged view of a main portion of FIG. 4.

FIG. 4 illustrates a perspective view of the cassette of FIG. 3, FIG. 5 illustrates an exploded perspective view of the cassette of FIG. 4, and FIG. 6 illustrates an enlarged view of a main portion of FIG. 4.

Referring to FIGS. 4 through 6, the cassette 200 includes a base frame 210, a tray 220, and a first electrical connection terminal 230. The base frame 210 may include a lower wall 212 in the form of a rectangular plate. A sidewall 214 protrudes upward (e.g., in the Z-direction) at the edge toward the lengthwise direction (e.g., the X-direction) among edges of the lower wall 212. A guide groove 215 is formed inside the sidewall 214 along the lengthwise direction of the sidewall 214. The guide groove 215 guides a guide rail 226 of the tray 220 to move in a straight line in the X-direction.

The tray 220 may include a lower wall 222 in the form of a rectangular plate. The SSD to be tested may be mounted on an upper side of the lower wall 222. A first sidewall 224a may protrude upward (e.g., in the Z-direction) at the edge toward the lengthwise direction (e.g., the X-direction) among edges of the lower wall 222, and a second sidewall 224b is protruded upward (e.g., in the Z-direction) at any one side of edges vertical to the lengthwise direction (e.g., the X-direction) of the lower wall 222. A guide groove 226 may be formed to protrude (e.g., protrude in the Y-direction) outside the first sidewall 224a along the lengthwise direction (e.g., the X-direction) of the first sidewall 224a. Tray 220 may move from a first position where the base frame 210 and the tray 220 are not in a position where they are ready to be coupled, and a second position where the base frame 210 and the tray 220 slidably move to couple together. In the second position, the SSD 100 and the connector 232 of the first electrical connection member 230 may interconnect.

Out of both ends of the guide rail 226, side 224c (e.g., the end far away from the second sidewall 224b) is inserted into an inlet of the guide groove 215 of the base frame 210, and the tray 220 moves along the lengthwise direction (e.g., the X-direction) of the base frame 210. Throughout these processes, the tray 220 may be secured to the base frame 210. Conversely, the tray 220 may be separated from the base frame 210 in reverse order of the above-described processes.

The first electrical connection member 230 is secured to the edge of the base frame 210 located in a direction opposite to an insertion direction (e.g., opposite the X-direction) of the tray 220 based on the lengthwise direction (e.g., the X-direction) of the base frame 210. The first electrical connection member 239 includes a connector 232, a connector bracket 234, and a circuit substrate 236. The connector 232 is disposed to be vertical to the lengthwise direction of the base frame 210 (e.g., the connector 232 is disposed in the Z-direction, which is perpendicular to the position of the base frame 210 in the X-direction) and coupled to the base frame 210 by the connector bracket 234. The external connection terminal of the SSD 100, which is mounted on the tray 220, is connected to the connector 232. The circuit substrate 236 may be electrically connected to the connector 232 and provided with, for example, a signal line and a power line. The circuit substrate 236 may be connected to the second electrical connection member 320 of the magazine 300, when the cassette 200 is loaded onto the magazine 300.

A displaying unit 240 may be provided at the base frame 210 to display whether the external connection terminal of the SSD is connected to the connector 232 of the first electrical connection member 230. The displaying unit 240 includes a light emitting device 242 and a light transmitting member 244. The light emitting device 242 may be a LED (Light Emitting Diode). As the light emitting device 242 is connected to the circuit substrate 236 of the first electrical connection member 230, the power may be supplied to the light emitting device 242. A tunnel 213 may be formed inside the sidewall 214 of the base frame 210 along the lengthwise direction (e.g., X-direction) thereof. The light emitting device 242 may be inserted into one end of the tunnel 213, and the light transmitting member 244 may be inserted into the other end of the tunnel 213. The light transmitting member 244 may be formed of transparent materials such as an acrylic to transmit light emitted from the light emitting device 242 to the outside.

The light emitting device 242 emits the light when the external connection terminal of the SSD is connected to the connector 232 of the first electrical connection member 230. The light is emitted through the light transmitting member 244. By the emitted light, operators may recognize that the external connection terminal of the SSD is connected to the connector 232 of the first electrical connection member 230.

Figure 7:
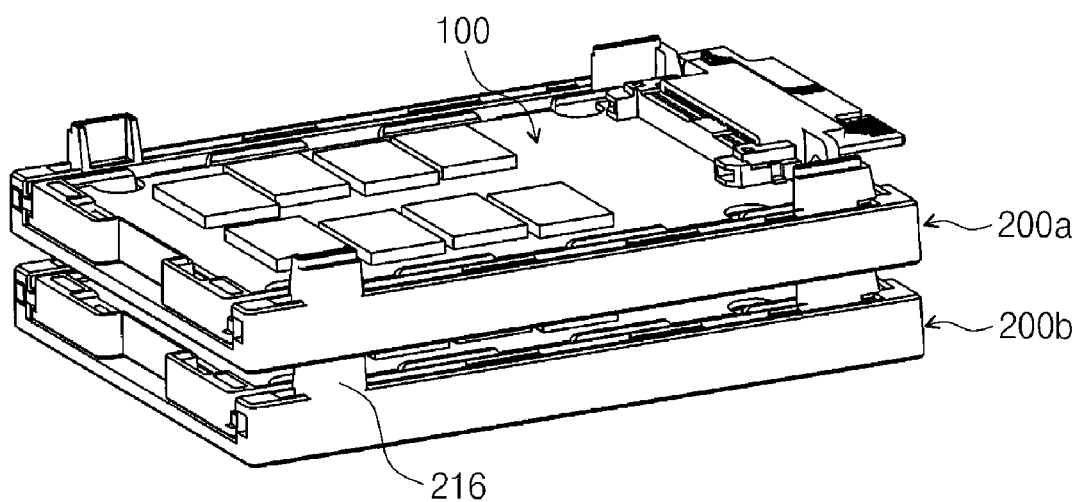
FIG. 7 illustrates a view illustrating a state in which cassettes are loaded by loading protrusions and loading grooves according to exemplary embodiments of the present general inventive concept.

FIG. 7 is a view illustrating a state in which cassettes are loaded by loading protrusions and loading grooves. Referring to FIGS. 5 through 7, the loading protrusions 216 may be formed at an upper surface of the sidewall 214 of the base frame 210 to protrude (e.g., in the Z-direction) from the upper face, and the loading grooves 218 may be formed at a lower surface of the lower wall 212 of the base frame 210 to correspond to the loading protrusions 216. When cassettes 200a and 200b that include the SSDs are not used for testing the electrical characteristics of the SSD, the loading protrusions 216 and the loading grooves 218 make it possible to load only the cassettes 200a and 200b. For example, when the loading protrusions 216 of the other cassette 200b are inserted into the loading grooves 218 of one cassette 200a, the cassettes 200a and 200b may be stacked and kept without using a separate accommodating member.

Figure 8:
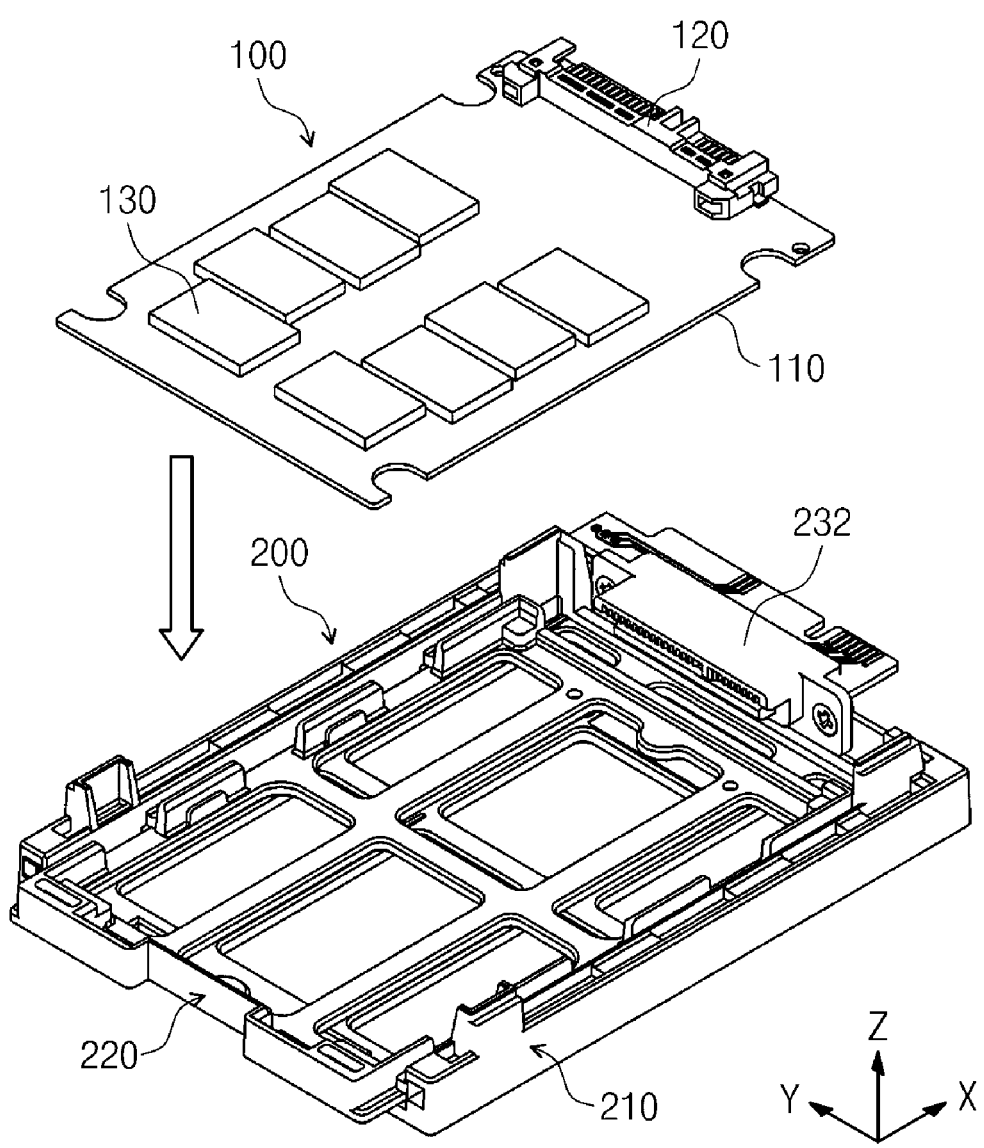
FIGS. 8 through 10 are views illustrating processes of mounting the solid state drive on the cassette according to exemplary embodiments of the present general inventive concept.
Figure 9:
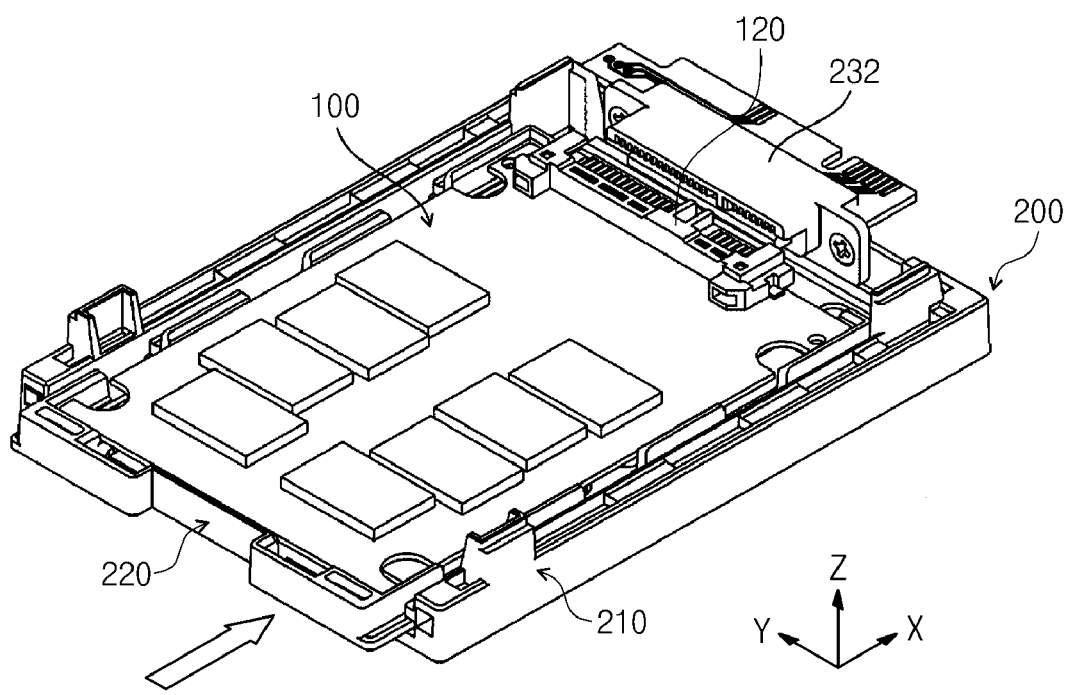
Figure 10:
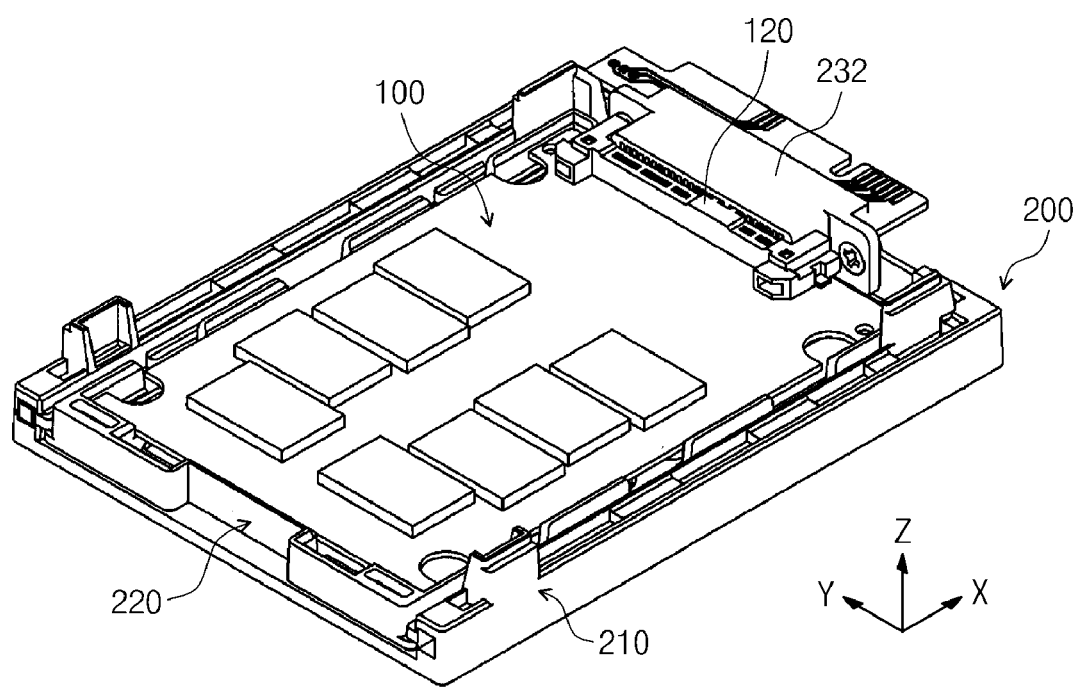

FIGS. 8 through 10 are views illustrating processes of mounting the SSD on the cassette according to exemplary embodiments of the present general inventive concept.

Referring to FIGS. 8 through 10, the SSD 100 may be in a bare state in which the SSD 100 is not enclosed in an external case, or the external case is not mounted on the SSD 100. The bared SSD includes a circuit substrate 110, an external connection terminal 120, a plurality of flash memories 130, a controller (not illustrated), and input/output controllers (not illustrated). The external connection terminal 120, the plurality of flash memories 130, the controller (not illustrated), and the input/output controllers (not illustrated) are mounted on the circuit substrate 110.

The external connection terminal 120 may be connected to input/output terminals of a computer or a mobile terminal. When the SSD 100 is mounted on the cassette 200 to test the electrical characteristics, the external connection terminal 120 may be connected to the first electrical connection member 230. Depending on the control of the controller (not illustrated), the plurality of flash memories 130 stores input data from the input/output controllers (not illustrated) and outputs data to be output to the input/output controllers (not illustrated).

In exemplary embodiments of the present general inventive concept, the SSD 100 may be mounted on the cassette 100. The tray 220 may be secured to the base frame 210 by inserting the guide rail of the tray 220 into the guide groove 215 of the base frame 210. The tray 220 may be recessed from the base frame 210 such that the external connection terminal 120 of the SSD 100 is connectable to the connector 232 of the cassette 200 (see FIG. 8).

The SSD 100 may be mounted on the tray 220, and the tray 220 to which the SSD 100 is mounted may move in the X-direction (see FIG. 9). The external connection terminal 120 of the SSD 100 may be connected to the connector 232 that is disposed on the base frame 210 (see FIG. 10).

The cassettes 200 that mount the SSDs 100 throughout the above-described processes may be received by the magazine 300, as illustrated in FIG. 2. The magazine 300 accommodating the cassettes 200 may be introduced into the SSD testing apparatus 1 of FIG. 1. The SSD testing apparatus 1 may test the electrical characteristics of the SSDs 100, and may sort the operable SSDs and the defective SSDs.

According to exemplary embodiments of the present general inventive concept, solid state drives having one or more sizes and forms may be tested by the testing apparatus 1 of FIG. 1 by replacing the tray.

According to exemplary embodiments of the present general inventive concept, damage to the external connection terminals of the bared solid state drives can be minimized.

Although several embodiments of the present invention have been illustrated and described, it would be appreciated by those skilled in the art that changes may be made in these embodiments without departing from the principles and spirit of the general inventive concept, the scope of which is defined in the claims and their equivalents.

What is claimed is:

1. An apparatus to test solid state drives, comprising:
a testing unit to test electrical characteristics of the solid state drives by applying test signals to the solid state drives;
a server that receives test results of the solid state drives from the testing unit and stores the tested results; and
a sorting-loading unit that sorts the solid state drives transferred from the testing unit into operable solid state drives or defective solid state drives according to the test results transmitted from the server, and loads the sorted solid state drives,
wherein the solid state drives are electrically connected to the testing unit through at least one magazine accommodating cassette on which the solid state drives are mounted, and the solid state drives are transferred to the sorting-loading unit by a movement of the magazine, and
wherein the magazine includes:
a housing formed with slots onto which the cassettes are loaded; and
second electrical connection members installed in the housing to connect first electrical connection members of the cassettes loaded onto the slots with the testing unit.

2. The apparatus of claim 1, wherein each of the cassettes includes:
a base frame provided with the first electrical connection member; and
a tray provided on the base frame to mount the solid state drive thereon, the tray being linearly movable toward the first electrical connection member,
wherein an external connection terminal of the solid state drive mounted on the tray is connected to the first electrical connection member by the linear movement of the tray.

3. The apparatus of claim 2, further comprising:
a guide rail that is provided at the tray along a linearly moving direction; and
a guide groove that is formed at the base frame to guide movement of the guide rail,
wherein the tray is detachably secured to the base frame by attachment of the guide rail to the guide groove and detachment of the guide rail from the guide groove.

4. The apparatus of claim 2, wherein the first electrical connection member includes:
a connector to connect with the external connection terminal of the solid state drive;
a connector bracket to couple the connector with the base frame; and
a circuit substrate that is electrically connected to the connector, and connected to the second electrical connection member of the magazine.

5. The apparatus of claim 4, wherein the cassette further includes:
a displaying unit that displays whether the external connection terminal of the solid state drive is connected to the connector of the cassette.

6. The apparatus of claim 2, wherein loading protrusions are formed at both sides of a moving path of the tray on an upper surface of the base frame, and loading grooves are formed at a lower face of the base frame to correspond to the loading protrusions.

* * * * *